United States Patent
Benvenuti et al.

(10) Patent No.: US 8,852,344 B2
(45) Date of Patent: Oct. 7, 2014

(54) LARGE AREA DEPOSITION IN HIGH VACUUM WITH HIGH THICKNESS UNIFORMITY

(75) Inventors: Giacomo Benvenuti, Ecublens (CH); Estelle Halary-Wagner, Ecublens (CH); Simone Amorosi, Ecublens (CH); Patrik Hoffmann, Epalinges (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 13/280,131

(22) Filed: Oct. 24, 2011

(65) Prior Publication Data

US 2012/0037077 A1 Feb. 16, 2012

Related U.S. Application Data

(63) Continuation of application No. 11/785,141, filed on Apr. 16, 2007, now abandoned, which is a continuation of application No. 10/512,838, filed as application No. PCT/CH03/00285 on May 2, 2003, now abandoned.

(30) Foreign Application Priority Data

May 3, 2002 (CH) .................... PCT/CH02/00241

(51) Int. Cl.
 - *C23C 16/00* (2006.01)
 - *C23C 16/455* (2006.01)
 - *H01L 21/306* (2006.01)
 - *C30B 23/06* (2006.01)
 - *C23C 14/24* (2006.01)

(52) U.S. Cl.
 CPC ............. *C23C 14/243* (2013.01); *C30B 23/066* (2013.01)

USPC .................................... 118/715; 156/345.33

(58) Field of Classification Search
 USPC ...... 118/726, 723 VE, 723 CB, 723 EB, 715; 156/345.33, 345.34
 See application file for complete search history.

(56) References Cited

U.S. PATENT DOCUMENTS

| | | | | |
|---|---|---|---|---|
| 2,354,521 A | * | 7/1944 | Hewlett | 118/726 |
| 3,271,562 A | * | 9/1966 | Roberts, Jr. et al. | 392/388 |
| 3,693,582 A | * | 9/1972 | Delcour et al. | 118/718 |
| 3,706,140 A | * | 12/1972 | Brillaud et al. | 34/60 |
| 4,592,308 A | * | 6/1986 | Shih et al. | 118/726 |
| 4,774,416 A | * | 9/1988 | Askary et al. | 250/492.2 |
| 5,019,531 A | * | 5/1991 | Awaya et al. | 438/605 |
| 5,505,778 A | * | 4/1996 | Ono et al. | 438/798 |
| 5,588,999 A | * | 12/1996 | Takahashi | 118/715 |
| 5,711,813 A | * | 1/1998 | Kadoiwa et al. | 118/723 VE |
| 5,725,674 A | * | 3/1998 | Moustakas et al. | 118/723 VE |
| 5,858,086 A | * | 1/1999 | Hunter | 117/84 |
| 5,951,767 A | * | 9/1999 | Colombo | 118/688 |
| 5,972,109 A | * | 10/1999 | Hunter | 117/204 |
| 5,976,263 A | * | 11/1999 | Poole | 118/726 |
| 6,011,904 A | * | 1/2000 | Mattord | 392/389 |
| 6,013,155 A | * | 1/2000 | McMillin et al. | 156/345.33 |
| 6,045,612 A | * | 4/2000 | Hunter | 117/84 |

(Continued)

Primary Examiner — Jeffrie R Lund
(74) Attorney, Agent, or Firm — Nixon & Vanderhye P.C.

(57) ABSTRACT

The invention relates to an effusing source for film deposition made of a reservoir comprising one hole characterized by the fact that the hole diameter is less than one order of magnitude than the mean free path of the molecules determined by the pressure and its thickness is at least one order of magnitude smaller than the diameter. Preferably the source has several holes.

1 Claim, 6 Drawing Sheets

(56) References Cited

U.S. PATENT DOCUMENTS

Figure 1:
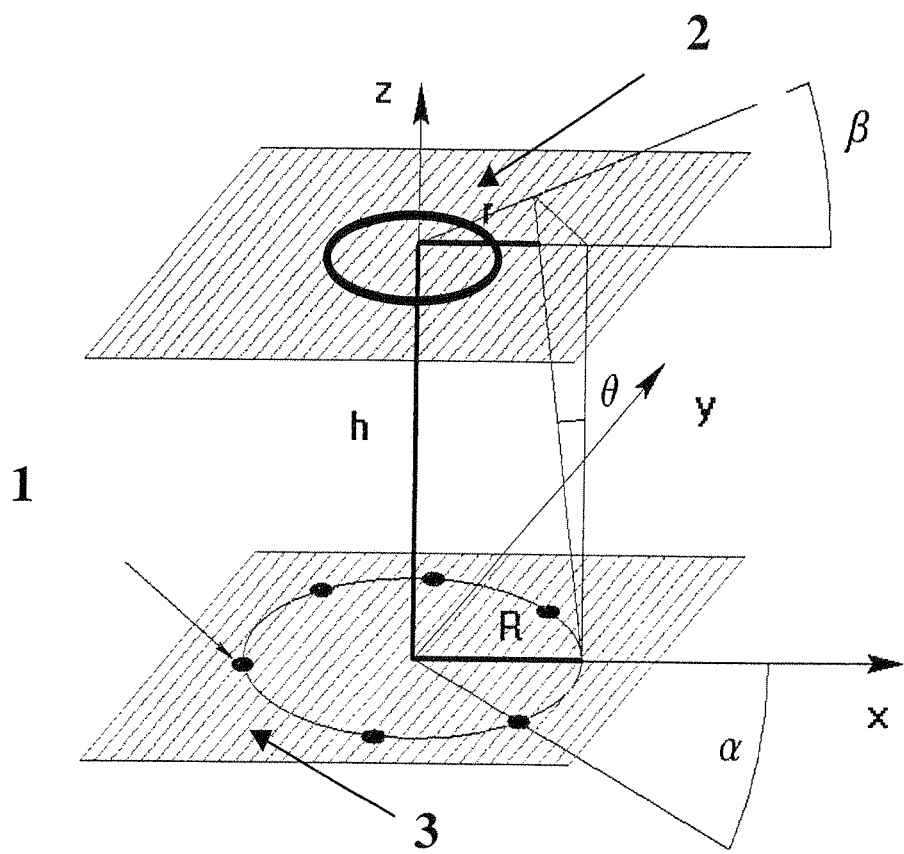

| | | | |
|---|---|---|---|
| 6,048,813 A * | 4/2000 | Hunter | 501/86 |
| 6,053,981 A * | 4/2000 | Salokatve et al. | 118/726 |
| 6,086,672 A * | 7/2000 | Hunter | 117/84 |
| 6,132,552 A * | 10/2000 | Donohoe et al. | 156/345.33 |
| 6,143,078 A * | 11/2000 | Ishikawa et al. | 118/715 |
| 6,835,277 B2 * | 12/2004 | Park | 156/345.33 |
| 2003/0041801 A1 * | 3/2003 | Hehmann | 118/715 |
| 2003/0150377 A1 * | 8/2003 | Arimoto et al. | 117/84 |
| 2004/0253365 A1 * | 12/2004 | Warren et al. | 427/2.1 |
| 2005/0166846 A1 * | 8/2005 | Benvenuti et al. | 118/726 |
| 2007/0193519 A1 * | 8/2007 | Benvenuti et al. | 118/726 |
| 2011/0239940 A1 * | 10/2011 | Benvenuti et al. | 118/715 |
| 2012/0037077 A1 * | 2/2012 | Benvenuti et al. | 118/724 |
| 2013/0037634 A1 * | 2/2013 | Miller et al. | 239/589 |

* cited by examiner

LARGE AREA DEPOSITION IN HIGH VACUUM WITH HIGH THICKNESS UNIFORMITY

This application is a continuation of U.S. patent application Ser. No. 11/785,141, filed on Apr. 16, 2007, now abandoned which is a continuation of U.S. patent application Ser. No. 10/512,838, filed on Nov. 24, 2004, now abandoned the entire contents of which are hereby incorporated by reference.

U.S. application Ser. No. 10/512,838 is the U.S. national phase of international application PCT/CH03/00285 filed May 2, 2003, which designated the U.S. and claims benefit of PCT/CH02/00241, dated May 3, 2002, the entire contents of which are hereby incorporated by reference.

FIELD OF THE INVENTION

The present invention relates to thermal or laser-assisted (electron or ion beam-assisted) film deposition with chemical precursors in the molecular regime.

STATE OF THE ART

The business and technology of large area vacuum coatings have made significant progresses in the last two decades and are still proceeding with great expectation for the future [1, 2]. In particular, we can mention typical applications as architectural and automotive glasses, solar cells, and micro-optoelectronics applications that require larger and larger substrates to reduce costs.

It is commonly believed that the alternative approach of vacuum deposition is difficult to scale up to industrial applications. Furthermore, vacuum deposition is also known to be inherently more expensive and difficult with these two drawbacks increasing as lower pressures are aimed at. However the use of vacuum deposition has some advantages for industrial applications. Indeed, high-throughput techniques, such as MOCVD, can produce large quantities of materials, while the precise in-situ control of thickness, purity and composition that can be achieved through MBE has been invaluable in developing the technology. A hybrid technique (called CBE, MOMBE, or GSMBE), consisting in molecular beams of CVD precursors, could provide a good solution: high control, possibility to grow good quality devices and higher growth rates than those typically obtained in conventional MBE. For these reasons, by 1990 most of the major electronics and telecommunication companies had a research effort in Chemical Beam Epitaxy [3].

Several patent documents discuss the increase of deposit uniformity both in thickness and in chemical composition. For vacuum deposition with chemical precursors, two precursor transport regimes have to be distinguished: Chemical Vapour Deposition (CVD) in the viscous or the transition regime and Chemical Beam Epitaxy (CBE) in molecular regime (also called Metal-Organic Molecular Beam Epitaxy (MO-MBE) or Gas Source MBE (GSMBE)). As a general rule, most of the patents are for CVD systems to solve the classical problems reported in literature. In the molecular regime very few patents have been deposited.

As a summary, we can report the following points:
CVD processes have a much higher production capacity, but suffer from poor utilization efficiency of the expensive and toxic reactants gases (L. M. Fraas, in U.S. Pat. No. 4,828,021). In opposition, MBE devices are not easily scalable to meet the needs of the growing market.

It should be desirable to have an apparatus and a process that could be extended to the general use of any metal organic gas in a vacuum environment to optimise the growth of uniform semiconductor layers on large area substrates while minimizing the disposal problems of the toxic reactant gases and the reaction by-products.

A greater degree of control over uniformity of coating and/or etch rate, with an ability to alter uniformity profiles in a selective and controlled manner, is required in deposition techniques (J. J. Schmitz reports U.S. Pat. No. 5,387,289).

Different gases in the source or in reaction chamber are liable to react very rapidly with each other (i.e. arsine and triethyl-indium). They cannot be mixed in advance and should be introduced simultaneously, but separately. Concentric annular arrays of sources have been proposed to provide different gases (Frijlink U.S. Pat. No. 4,961,399), but several problems are still open.

Rotation, or planetary motion, was also introduced to provide uniform thickness (Frijlink U.S. Pat. No. 4,961, 399), but light processes are incompatible with such a motion.

Plurality of vapour streams to generate partially overlapping molecular angular distributions has been proposed (Chuong Van Tran U.S. Pat. No. 6,082,296). Zinck reports a source with an array of micro-channels to use as a gas source for MBE (U.S. Pat. No. 5,188,671). With this over-cosine collimated source, the growth rate can be increased as the local pressure at the surface of the wafer can be over 100 times higher than the residual pressure.

A state of the art is given by Tanabe for vacuum coatings of large area substrates and high precursor efficiency use (patent EP 0 982 411 A2). This is the closest result found for patent to our proposed invention, but uniformity is only about 5-10% and is hence not suitable to many applications.

What can be said is that no global solution has been found up to now and the above cited patent document have only solved some of the specific mentioned problems.

The following points and basic understanding are reported by non-patent literature. In particular, viscous and transition regimes are poorly, if not at all, compatible with light (electron ion)-assisted processes. Furthermore, flexibility is poor to achieve good thickness uniformity (inter-correlation of deposition parameters), while up-scaling to larger substrates or upgrading to new materials is not straightforward and can be very difficult. We will hence focus on the molecular beam regime.

In the molecular regime, gas-phase collisions are assumed negligible compared to molecules to walls collisions. Equivalently, we can say that the mean free path of molecules is large compared to the chamber geometry. This line of sight travelling of molecules leads to exact modelling of their distribution on whatever surface is used as a deposition area and is independent of parameters such as substrate temperature or precursor molecular species. Due to the closed relation with light propagation, several authors have compared particle effusion with light in a diffusive medium [6, 7]. In molecular beam conditions, we can suppose to be in conditions that are similar to a very transparent medium for light. In particular, the gas inlet system, consisting in one or more effusive sources with given molecular angular distribution and relative position compared to the deposition area, can be assumed theoretically as the unique parameter influencing molecular impinging rate distribution on the deposition area [8, 9].

Experimentally however, several effects can modify this view [10]. Among these effects, we can list vapour pressure uncertainties, the cosine emission law from walls when the walls are not totally inert against the vapours (surface diffusion [11] and specular reflexions of molecules on surfaces [12]). These effects are however very limited to the working temperatures below 100-200° C. required avoiding chemical precursor adsorption and sufficient vapour pressure. Another effect that can make fail attempts to produce uniform impinging rate on the deposition area is that molecules can bounce on walls inside the deposition chamber. These scattered molecules would hence lead to uncontrolled deposition. This drawback can be reduced with liquid nitrogen cryopanels that will condense both unused precursor and by-products. Analytical modelling [13, 14], Monte Carlo simulations [15-17], and experimental work [9, 18, 19] have been used extensively to achieve parameters optimisation. Very good agreement is usually achieved between experiments, simulations and analytical modelling if the previously described precautions are taken.

Sources flow angular distribution and their relative position to the deposition area can hence be assumed, practically and not only theoretically, as the key parameter to achieve high uniform thickness. Effusive sources are defined as apertures between the main chamber, in which precursor molecules in the form of molecular beams will impinge on the deposition area, and a reservoir (in our case a single pre-chamber common to all the sources for a given precursor) in which higher-pressure conditions occur ranging from the viscous, through the transition, to the molecular regime. Evaporation sources are used in physical vapour deposition processes and generally require very high temperatures necessary to reach sufficient vapour pressure, while gas sources use volatile chemical precursors resulting in high enough pressures even at temperatures as low as 100° C.

The difficulty in the molecular flow regime is to achieve simultaneously both high thickness uniformity and high growth rates [4], which are usually related to high efficiency use of precursor [4, 5], and high initial investment costs [1] as reducing the size of the reactor usually allows reduced equipment costs, but also leads to poor thickness uniformity.

An important aspect to be considered in the deposition process using effusive sources is the growth rate, which is tightly related to the source flow throughput. This flow can be assumed proportional to the aperture area of the source and to the vapour pressure of the gas at a given temperature even if some exceptions exist to this rule (for example collisions inside small capillaries reducing effusion [20]).

Large aperture sources are usually required both in physical evaporation and gas sources configuration. The effusing area can however be either a single large area source or distributed among several smaller sources. Small apertures have not been used very often in physical vapour deposition sources because difficulties appear due to regulation of each source. These sources are furthermore expensive and unstable as the vapour condensation and evaporation can modify the effusion. Gas phase sources are user-friendlier and allow the use of smaller sources without the described drawbacks, but have only been investigated recently.

The advantage of small sources lays in the more precise control of flow throughput as discussed by Vassent [10]. The limit is given for ideal sources (very small effusion orifices compared to molecular mean free path related to pressure (about 0.5 mm at $10^{-2}$-$10^{-3}$ mbar)) by the pressure (temperature) control of the cell. In large aperture cells thermal equilibrium is not warranted, while small apertures, like in Knudsen effusion, work as thermal blackbody.

Another reason that makes small gas sources more attractive is that sources are generally tilted to the normal of the deposition area to increase uniformity [21]. Physical reasons may limit this tilting angle that is not always optimal for evaporation sources due to liquid geometry level considerations [5]. Finally, smaller sources compared to a single large source are interesting as light induced or light enhanced deposition is incompatible with substrate motion. For sources that are stable over the time interval required for a few revolutions of the substrate, substrate rotation is equivalent to a continuous ring of identical sources [18].

In addition to the growth rate and geometrical distribution of sources as discussed here above, another important parameter has to be discussed: the angular distribution of molecules effusing from the source. Literature on the subject is extensive from first works of Knudsen at the beginning of the XX$^{th}$ century and will not be reported here. A complete review is given by Stekelmacher to understand effusion mechanism and the different effusion sources in different regimes [22].

The first quality of a source with respect to angular distribution is reproducibility and stability. One of the problems in MBE sources is that the source angular distribution may vary to a large extent as a function of the filling level. This leads to poorly controllable angular distributions of effusing molecules with time [23]. Gas sources are generally more reliable, but care must be taken to control molecular angular distribution that can depend on pressure. Another error that can account for different angular distributions is that the source dimension aperture can have a deep impact on the molecular distribution. In opposition to the previously discussed case where the orifice aperture was compared to the mean free path, the source aperture geometry must now be compared to the distance between the source and the deposition area. Leiby has studied this for molecules effusing from circular and rectangular apertures [14]. He demonstrated that for large distances of the source from the deposition area compared to the source diameter, every source can be considered as a point source. Point sources are more easily dealt with as they can be assumed as ideal sources (the angular distribution is constant as a function of the distance to the deposition area). Winkler [24], for example, reports a formalism to consider non point-like circular sources that follows a procedure previously described by Olander [25].

Point sources can arbitrarily be subdivided into three classes as reported by Cale [8]: cosine sources (Knudsen sources) over-cosine and under-cosine sources depending on their degree of collimation. The most investigated sources are the over-cosine sources [22] [26] mainly because they can reach higher growth rates [4] and optimise precursor use. However, such collimated sources lead to several problems. Among these we can list a general increase in source-deposition area distance to keep uniform impinging rates and higher sensitivity to misalignments [10]. Under-cosine sources in opposition to more focused sources have been poorly discussed in literature.

The obtained results reported by the scientific community with regard to thickness uniformity deposition are in general difficult to evaluate if the parameters of reactor size versus substrate size are introduced. Uniformity of a few percent can be achieved with a single source and a rotation of the substrate. An order of magnitude improvement in the film thickness uniformity can be obtained with planetary motions of the substrate or by introducing suitable masks [27] or both. However, thickness uniformity is closely related to the deposition area diameter, the precursor efficiency use, and growth rates [4]. As a general rule, thickness uniformity decreases rapidly with deposition increasing area and with reduced distance of the sources to the deposition area. Jahan et al. report a thickness uniformity of about 3% on a 2-inch diameter substrate [28]. Aers reports a uniformity of 3-4% over a 3-inch substrate [29]. Spring Thorpe achieved a thickness uniformity of 3% on a 76 mm diameter substrate, but uniformity quality degrades rapidly to 20% as the crucible empties [5]. All these references however, do not report any source-deposition area distance neither an evaluation of the ratio between the molecules impinging on the deposition area compared to the total effused molecules, which are important parameters for an optimized cost effective deposition system. A systematic approach and a good understanding of these parameters are still lacking.

SUMMARY OF THE INVENTION

The invention relates to a novel small point gas source (using chemical precursors) for vacuum deposition in the molecular regime able to lead to highly uniform thickness on large areas with small reactor size and high precursor efficiency use. The source design is also compatible with light-assisted (electron or ion-assisted) deposition. As alternative to deposition, homogeneous etching can be achieved if it relies on impinging rate of etching chemical on a given area.

The reactor design is such that the source relative position and its angular distribution of effusing molecules are the only parameters accounting for their distribution on the substrate. Because of the line of sight propagation of the molecules in the molecular regime, the distribution of impinging molecules on the substrate can be calculated mathematically.

In particular, the reactor is composed of a precursor reservoir heated (for example by a thermo-regulated oil-bath up to temperatures of 200° C.) connected to a pre-chamber with a ring shape allowing irradiation of the substrate through its centre. Four or more sources, consisting in holes in a vacuum tight sheet separating the pre-chamber from the deposition chamber, where the substrate is positioned, are responsible of the molecular impinging distribution on the substrate. The effusing rate is controlled by regulating the pressure and the temperature of the pre-chamber resulting in only one single cost efficient system control for all the sources. All the system is baked at a temperature at least 20° C. higher than the temperature of the precursor reservoir to avoid precursor condensation. A cryopanel is used to condense all the molecules effusing from the sources that do not collide directly on the substrate and of the by-products resulting from the chemical decomposition of the precursor. A pumping system is used to achieve a vacuum between $10^{-12}$ and $10^{-3}$ mbar in the deposition chamber and a vacuum between $10^{-6}$ and 10 mbar in the pre-chamber.

Furthermore, the characteristics of the sources have been chosen for the following reasons:
1. Gas sources:
   Low temperatures in the effusing cell.
   Multiple sources are easily achievable (cost effective solution).
   Small sources do not get clogged.
   Stability in time.
   All orientations are possible independently on the filling level of the source.
   Generally higher throughput.
   Higher reproducibility.
   Ideal conditions to model mathematically.
2. Small sources (small diameter compared to mean free path of molecules in the pre-chamber):
   Thermodynamic equilibrium is guaranteed.
   Ideal to model mathematically.
3. Point sources (small diameter compared to distance of the source to the deposition area):
   No variation of angular distribution as a function of distance to the deposition area.
   Ideal to model mathematically.
4. Large aspect ratio between hole thickness and hole diameter:
   No opaque regime that reduces effusion.
   Effusing flow oriented normal to the surface. No complications due to poor controlled holes orientation.
5. New ad hoc molecular angular distributions:
   Non-focused sources to minimize misalignments effects on thickness uniformity for deposition area.
   Non-focused sources to minimize reactor size: a larger acceptance angle is possible compared to more focused distributions.
   Reduced precursor flow outside the deposition area (i.e. for angles lower and/or greater than critical angles (asymmetric sources)).
6. Single pre-chamber connected to all the effusing sources
   Simple and reproducible
   Cost effective solution
   Graded composition possible by precursors inter-diffusion
7. Disposition of the sources on one or more rings with possibly a tilt between the rings
   Avoid substrate rotation and/or planetary motion
   Different materials co-deposition with controlled composition and thickness uniformity

DETAILED DESCRIPTION OF THE INVENTION

A. The Effusion Source

A typical effusion source is a hole of 0.5 mm drilled in a foil of 0.05 mm of thickness between a reservoir (pre-chamber) with a pressure of $10^{-3}$-$10^{-2}$ mbar and the deposition chamber with a pressure below $10^{-3}$ mbar. The hole dimensions however, depend on the pressure in the pre-chamber and on the substrate size, and could vary from 0.001 and 50 mm. Furthermore, the thickness of the hole is about one order of magnitude (or more) smaller than the diameter, while the distance of the source to the deposition area is one order of magnitude (or more) larger than the diameter of the hole.

B. Disposition and General Description of the Sources

The combination of several sources may allow substrate rotation avoidance. Several holes are uniformly distributed on an annular geometry (see FIG. 1). The formula that describes the distribution of impinging molecules on a planar surface for several $\cos^n$ distributions of the effusion sources distributed on a ring is the following:

$$I(\vartheta) = I_0\cos^n(\vartheta) \Rightarrow I_{tot} = I_0 \sum_{i=1}^{p}\left[\frac{h}{\sqrt{h^2 + R^2 + r^2 - 2Rr\cos\left(\beta - i\frac{2\pi}{p}\right)}}\right]^n$$

For Knudsen effusion sources n=4 (cosine sources).

To illustrate the concept of reactor size reduction with opportune thickness uniformity, several examples of angular distribution shaping (as reported in the summary of the invention point 5) are provided in Table-1. Analytical modelling of precursor transport is applied to find the adequate parameters providing molecular impinging uniformity better than 1% on a 150 mm substrate for various arbitrary $\cos^n$ distributions, distance h of the sources to the substrate, and radius R of the ring on which are distributed the sources (see Table-1). With the parameters reported in Table-1, the distributions are identical with an error less than 0.1%. These cos" sources (with n<4 under-cosine sources) are not existing sources nor are they to be considered optimal sources, but are used only to show that the trend of the reactor size is reduced with decreasing the focusing of the source.

TABLE 1

Geometrical disposition of the holes (both R, h varied) as a function of the effusing beam angular distributions (cos") to achieve uniformity better than 1%.

| | Distribution | | | | | | |
|---|---|---|---|---|---|---|---|
| | $Cos^1$ | $Cos^2$ | $Cos^3$ | $Cos^4$ | $Cos^5$ | $Cos^6$ | $Cos^8$ |
| R value (mm) | 99.2 | 113.2 | 119.57 | 122.4 | 124 | 127 | 129 |
| h value (mm) | 57 | 100 | 133 | 159 | 181.5 | 205 | 242 |

Introducing a tilting angle (see FIG. 2), the dimensions can be further decreased. The more general equation is:

$$I_{tot} = I_0 \sum_{i=1}^{p} \left[ \frac{-x_s(x-x_s) - y_s(y-y_s) + h\sqrt{x_s^2 + y_s^2}\tan\Phi}{\sqrt{((x-x_s)^2 + (y-y_s)^2 + h^2)(x_s^2 + y_s^2)(1+\tan^2\Phi)}} \right]$$

Similar distributions (within still an error of less than 0.1%) are achieved with parameters reported in Table-1 and Table-2. We can see that the dimensions can be further reduced with a small tilting angle of the sources. Furthermore, several tilted concentric rings could be considered equivalent to planetary motion.

It can be shown that this angle is smaller and less critical on uniformity distribution for under-cosine sources.

TABLE 2

Geometrical disposition of the holes (R, h and $\Phi$) for $Cos^1$ distribution to achieve distribution uniformity better of 1% on a 150 mm wafer.

| | Tilt angle ($\pi/2 - \Phi$) | | | |
|---|---|---|---|---|
| | 0° | 3° | 6° | 9° |
| R value (mm) | 122.4 | 98 | 96 | 80.8 |
| h value (mm) | 57 | 48 | 38 | 17.2 |

C. Molecular Beam Shaping

The second point discussed is how to achieve the desired distribution shaping of the sources required for the already discussed reasons in point 5 of the summary of the invention. In particular, under-cosine distributions for small angles and over-cosine distributions for greater angles corresponding to regions outside the substrate (see FIG. 3) are aimed at. A tilt angle could be considered the first step in molecular beam modification (relative to the substrate), but this method is very limited. Two other solutions are proposed, as examples, but should not be considered exhaustive.

First Source Design

The first design is based on selecting and promoting molecules escaping the source with a given angle. Two different types of molecules will escape the source: the molecules that had the last collision inside the pre-chamber with another molecule and those that had the last collision on a surface inside the source.

On one hand, a volume below the effusing aperture is a forbidden region for gas phase collision. On the other hand, a pumping aperture will act as a trap for surface scattered molecules. Counterbalancing both effects could lead to shaped distributions. Furthermore, variable pressure configuration could lead to variable angular distributions without any moving part or modifications of the set-up.

Figure 4:
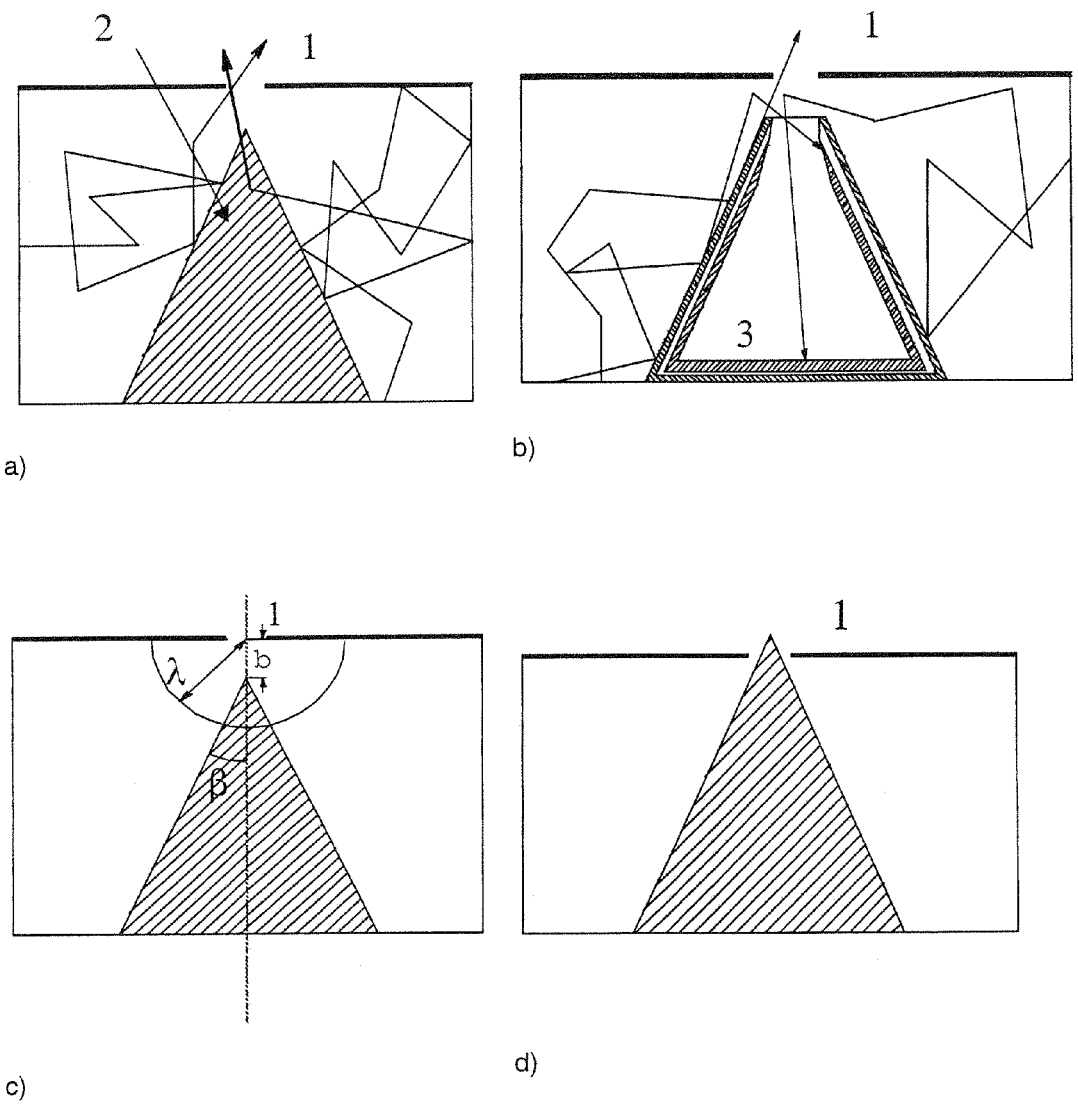

An example to reduce molecules effusing at small angles is reported in FIG. 4 with a cone-like shaped forbidden volume. Any kind of structure could serve to reach this purpose. In the cone-case, the apex may be cut and a hole provides a pumping aperture. If the cone is positioned under the hole at a distance $b \neq 0$, we will have a progressive increase of the volume, as angle will increase that will depend on the ratio between the distance b and the mean free path $\lambda$. In particular, variable pressure configuration will lead to variable effect of the cone as the mean free path is changed. A particular case of this configuration could be a negative parameter b; i.e. the cone exits the pre-chamber through the hole. As multiple sources are to be used, mechanical complexity of multiple cones can be avoided by producing a continuous structure.

Second Source Design

As a general rule, any kind of molecular angular distribution can be achieved by opportune disposition of several holes a 3-D surface. However, only in the case in which these sources are dispatched close together compared to their distance to the deposition area we can consider them as a single point source with the advantage of easy mathematical modelling. Furthermore, the total area of the holes should be small compared to the area separating the 3D surface from the pre-chamber to avoid gas depletion and pressure gradients. Furthermore, each single hole must satisfy the rules introduced previously in the summary of the invention.

A particular shape of interest is a hemisphere (see FIG. 5). In particular asymmetric sources are easily produced leading to gas waste reduction.

FIGURES SUMMARY

FIG. 1:
Disposition of effusion holes with annular geometry (1). R is the radius of the ring on which are distributed the holes, r is the distance from the centre on the substrate (2), and h is the distance of the substrate from the holes containing plane (3).

Figure 2:
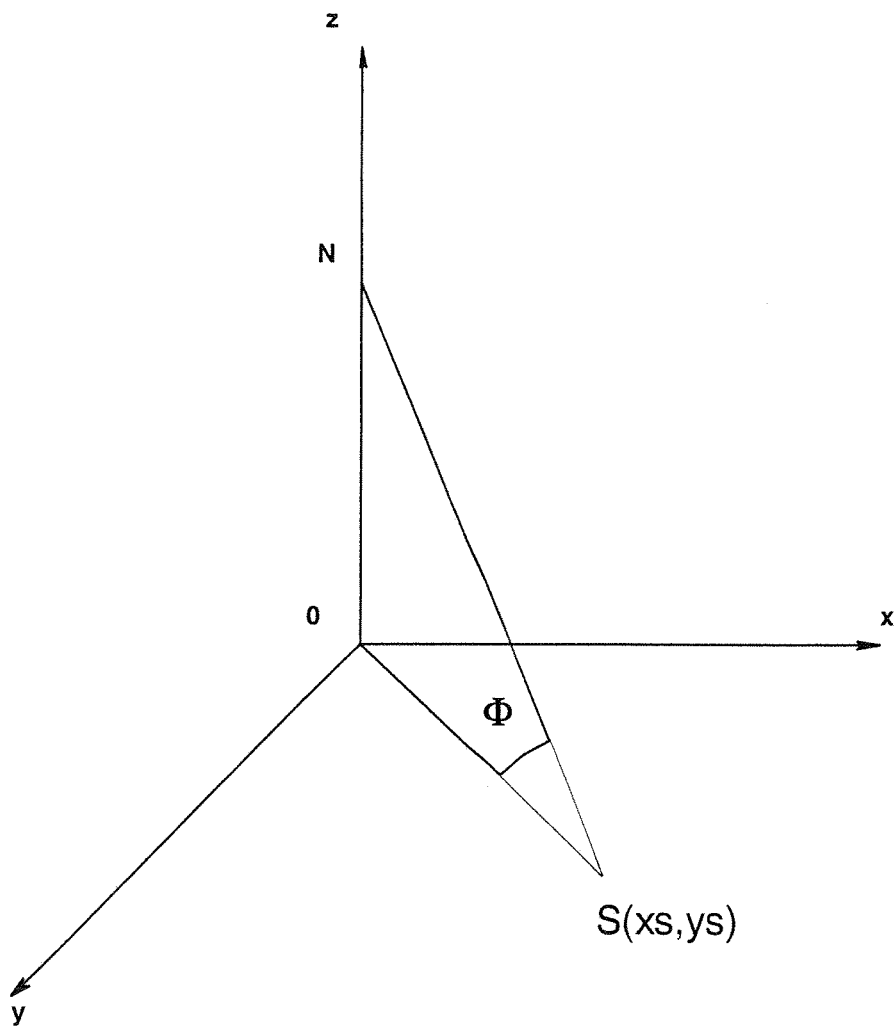

FIG. 2:
$\Phi$ is the tilt angle of the surface on which is the source S and is oriented towards the z-axis.

Figure 3:
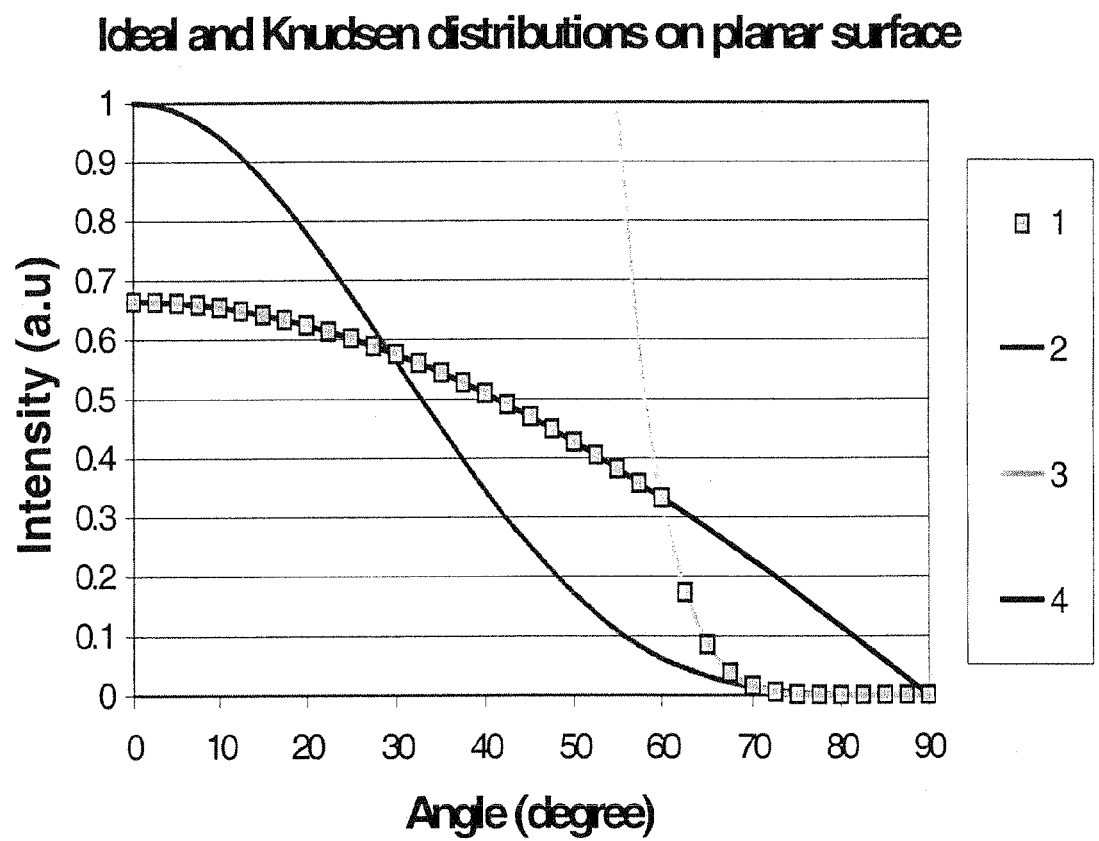

FIG. 3: Shape of the ideal angular distribution (1), to achieve high impinging rate uniformity and small reactor size, compared to Knudsen effusion (2). Both curves are normalised to achieve same number of effusing molecules. In the ideal curve (1), 60° is assumed to be the cut-off plane that discriminates between deposition on and outside the deposition area. A rapid decrease of the molecules occurs after this critical angle and the under-cosine distribution (4) is modified resulting in an over-cosine distribution (3). Asymmetric sources could also prove useful.

FIG. 4: The source is composed of a hole (1), a volume (2) that reduce the region where gas phase collisions are allowed, and a pumping aperture (3) that reduce the surface from which scattered molecules can exit the source. Gas phase collisions are restricted to larger angles in FIG. 4a. Surface scattered molecules are reduced for small angles FIG. 4b. When the parameter b is not null, a variation in pressure induces a variation of the mean free path $\lambda$. A different contribution of the cone to angular distribution is hence achievable as a function of pressure in FIG. 4c. The structure can also exit the source as reported in FIG. 4d.

Figure 5A:
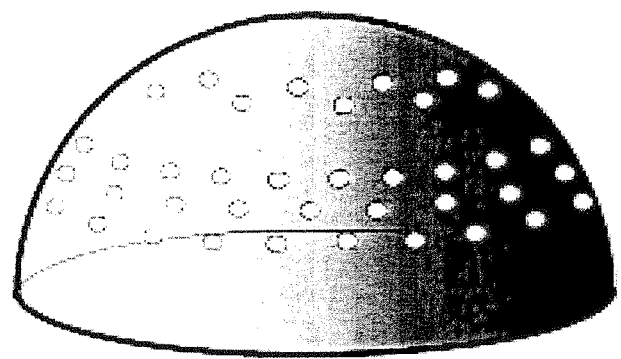

FIG. 5a: Fractal source composed of a distribution of effusing holes on a hemispherical surface.

Figure 5B:
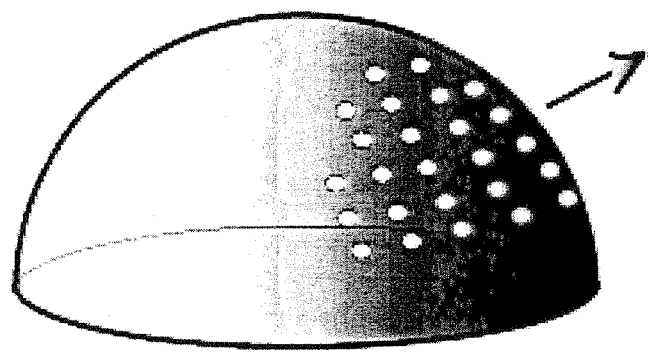

FIG. 5b: Asymmetric fractal source with preferential orientation of the molecular beam.

Figure 6:
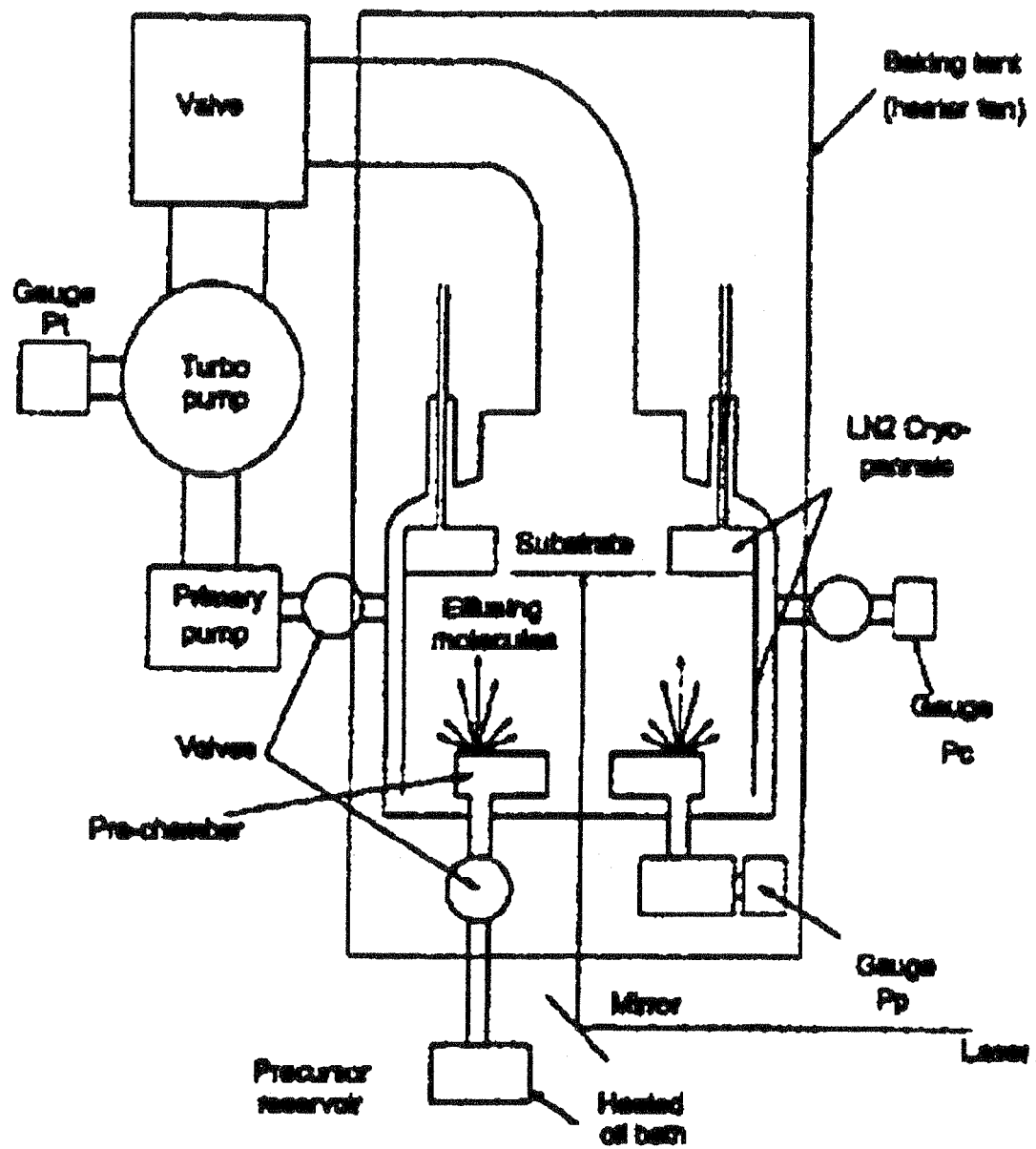

FIG. 6: General schematic reactor overview.

BIBLIOGRAPHY

1. Suzuki, K., *State of the art in large area vacuum coatings on glass*. Thin solid films, 1999. 351: p. 8-14.
2. Bugaev, S. P. and N. S. Sochugof, *Production of large-area coatings on glasses and plastics*. Surface and coating technology, 2000. 131: p. 474-480.
3. Tsang, W. T., *Progress in chemical beam epitaxy*. Journal of Crystal Growth, 1990. 105: p. 1-29.
4. Scheinowitz, D. A., et al., *Comparative study of molecular beam injection systems for gas source molecular beam epitaxy*. Journal of crystal growth, 1993. 127: p. 986-989.
5. Spring Thorpe, A. J., et al., *Improved thickness uniformity in molecular beam epitaxial growth of GaAs*. J. Vac. Sci. Technol. A, 1991. A9(6): p. 3175-3177.
Michalak, L., B. Adamczyk, and A. Herman, *Optical simulation of the beam flux distribution from molecular beam epitaxy effusion sources*. Vacuum, 1992. 43(4): p. 341-345.
7. Adamczyk, B., L. Michalak, and E. Marcinkowska, *Optical modelling of MBE systems*. Vacuum, 1991. 42(5): p. 971-977.
8. Cale, T. S., *Flux distribution in low pressure deposition and etch model*. J. Vac. Sci. Technol. A, 1991. B9(5): p. 2551-2553.
9. Guevremont, J. M., S. Sheldon, and F. Zaera, *Design and characterization of collimated effusive gas beam sources: effect of source dimension and baking pressure on total flow and beam profile*. Rev. Sci. Instrum., 2000. 71(10): p. 3869-3881.
10. Vassent, J.-L., et al., *Angular distribution of molecular beams and homogeneous layer growth: optimisation of geometrical parameters in molecular beam epitaxy*. Vacuum, 2002. 64: p. 65-85.
11. Winterbottom, W. L., *Spatial distributions of the vapor species in alkali halide effusion beams*. The J. of Chemical Physics, 1969. 51(12): p. 5610-5613.
12. Cieplak, M., J. Koplik, and J. R. Bavanar, *Molecular dynamics of flows in the Knudsen regime*. Physica A, 2000. 287: p. 153-160.
13. Cale, T. S., G. B. Raupp, and T. H. Gandy, *Free molecular transport and deposition in long rectangular trenches*. J. Appl. Phys., 1990. 68(7): p. 3645-3652.
14. Leiby, C. C. J., *Molecular beams and effusive flows*. Am. J. Phys., 1979. 47(9): p. 791-796.
15. Smith, C. G. and G. Lewin, *Free molecular conductance of a cylindrical tube with wall sorption*. J. Vac. Sci. Technol., 1965. 3(3): p. 92-95.
16. Fenter, F. F., F. Caloz, and M. J. Rossi, *Paper II: simulation of flow conditions in low-pressure flow reactors (Knudsen cells) using a Monte Carlo technique*. Rev. Sci. Instrum., 1997. 68(8): p. 3180-3186.
17. Kirsch, S., J. Griesche, and W. Gericke, *Monte-Carlo simulations of the beam flux distribution of molecular beam epitaxy sources by consideration of intermoluecular collisions*. Phys. Stat. Sol. A, 1991. 123: p. 441-450.
18. Dobrowolski, J. A., M. Ranger, and R. L. Wilkinson, *Measurement of angular evaporation characteristics of sources*. J. Vac. Sci. Technol. A, 1983. 1(3).
19. Buckman, S. J., et al., *Spatial profiles of effusive molecular beams and their dependence on gas species*. Meas. Sci. Technol., 1993. 4: p. 1143-1153.
20. Gray, D. C. and H. H. Sawin, *Design considerations for high-flux collisionally opaque molecular beams*. J. Vac. Sci. Technol. A, 1992. 10(5): p. 3229-3238.
21. Nanbu, K. and Y. Watanabe, *Thickness distribution of films fabricated by the molecular beam epitaxy technique*. Vacuum, 1986. 36(6): p. 349-354.
22. Steckelmacher, W., *Knudsen flow 75 years on: the current state of the art for flow of rarefied gases in tubes and systems*. Rep. Prog. Phys., 1986. 49: p. 1083-1107.
23. Gericke, W., M. Höricke, and J. von Kalben, *A detailed study of the molecular beam flux distribution of MBE effusion sources*. Vacuum, 1991. 42(18): p. 1209-1212.
24. Winkler, A. and J. T. Yates, *Capillary array dosing and angular desorption distribution measurements. A general formalism*. J. Vac. Sci. Technol. A, 1988. A6(5): p. 2929-2932.
25. Olander, D. R., J. Appl. Phys., 1969. 40: p. 4650.
26. Herman, M. A. and H. Sitter, *Sources of atomic and molecular beams*, in *Molecular Beam Epitaxy. Fundamentals and current status*, M. A. Herman and H. Sitter, Editors. 1996, Springer: Berlin. p. 29-72.
27. Sadra, K., C.-H. Lin, and J. M. Meese, *Masking and thickness uniformity in molecular beam epitaxy*. J. Vac. Sci. Technol. B., 1995. 13(6): p. 2269-2275.
28. Jahan, D., A. F., and J. L. Benchimol, *Beam geometrical modelling of CBE on nonplanar surfaces*. Journal of crystal growth, 1998. 188: p. 176-182.
29. Aers, G. C. and Z. R. Wasilewsky, *Improved growth uniformity in molecular-beam epitaxy: alternative strategies*. J. Vac. Sci. Technol. B, 1992. 10(2): p. 815-818.

The invention claimed is:

1. A vacuum deposition/etching apparatus in a molecular regime comprising:
   a deposition chamber with a deposition area,
   a pre-chamber having a center,
      wherein said pre-chamber allows irradiation of the deposition area through a void in the center of the pre-chamber,
      wherein said pre-chamber and said deposition chamber are separated by several apertures,
      wherein said apertures are fractal sources distributed on an annular geometry,
   a cryopanel to condense unused precursor molecules, which do not collide directly on the deposition area, and by-products.

* * * * *